United States Patent
Wang et al.

(10) Patent No.: US 8,094,428 B2
(45) Date of Patent: Jan. 10, 2012

(54) WAFER GROUNDING METHODOLOGY

(75) Inventors: Yi Xiang Wang, Fremont, CA (US); Juying Dou, San Jose, CA (US); Kenichi Kanai, Palo Alto, CA (US); Jun Jiang, Fremont, CA (US); Zheng Fan, Beijing (CN); Qingyu Meng, Beijing (CN); Jay Chen, Fremont, CA (US)

(73) Assignee: Hermes-Microvision, Inc., Hsinchu (TW)

( * ) Notice: Subject to any disclaimer, the term of this patent is extended or adjusted under 35 U.S.C. 154(b) by 332 days.

(21) Appl. No.: 12/259,216

(22) Filed: Oct. 27, 2008

(65) Prior Publication Data

US 2010/0103583 A1    Apr. 29, 2010

(51) Int. Cl.
*H01L 21/683* (2006.01)

(52) U.S. Cl. ........................................ 361/234
(58) Field of Classification Search .................. 361/234
See application file for complete search history.

(56) References Cited

U.S. PATENT DOCUMENTS

| | | | |
|---|---|---|---|
| 5,179,498 A * | 1/1993 | Hongoh et al. | 361/234 |
| 5,625,526 A | 4/1997 | Watanabe et al. | |
| 6,068,964 A | 5/2000 | Komori | |
| 6,214,162 B1 * | 4/2001 | Koshimizu | 156/345.28 |
| 6,465,795 B1 | 10/2002 | Madonado et al. | |
| 6,511,897 B2 | 1/2003 | Arima et al. | |
| 6,606,234 B1 | 8/2003 | Divakar | |
| 6,665,168 B2 | 12/2003 | Lin | |
| 6,734,429 B2 | 5/2004 | Takagi | |
| 6,753,524 B2 | 6/2004 | Matsui et al. | |
| 7,123,350 B2 | 10/2006 | Akutsu et al. | |
| 7,408,760 B2 | 8/2008 | Tanimoto et al. | |
| 7,432,209 B2 * | 10/2008 | Delgadino et al. | 438/709 |
| 2002/0141133 A1 * | 10/2002 | Anderson et al. | 361/234 |
| 2007/0089672 A1 | 4/2007 | Shimamura et al. | |
| 2008/0100983 A1 | 5/2008 | Purohit et al. | |
| 2009/0122458 A1 * | 5/2009 | Lischer et al. | 361/234 |
| 2010/0110603 A1 * | 5/2010 | LaFontaine et al. | 361/234 |

* cited by examiner

*Primary Examiner* — Jared Fureman
*Assistant Examiner* — Scott Bauer
(74) *Attorney, Agent, or Firm* — Sawyer Law Group, P.C.

(57) ABSTRACT

An apparatus for increasing electric conductivity to a wafer substrate, when exposed to electron beam irradiation, is disclosed. More specifically, a methodology to breakdown the insulating layer on wafer backside is provided to significantly reduce the damage on the wafer backside while proceeding with the grounding process.

17 Claims, 7 Drawing Sheets

The setup of present invention.

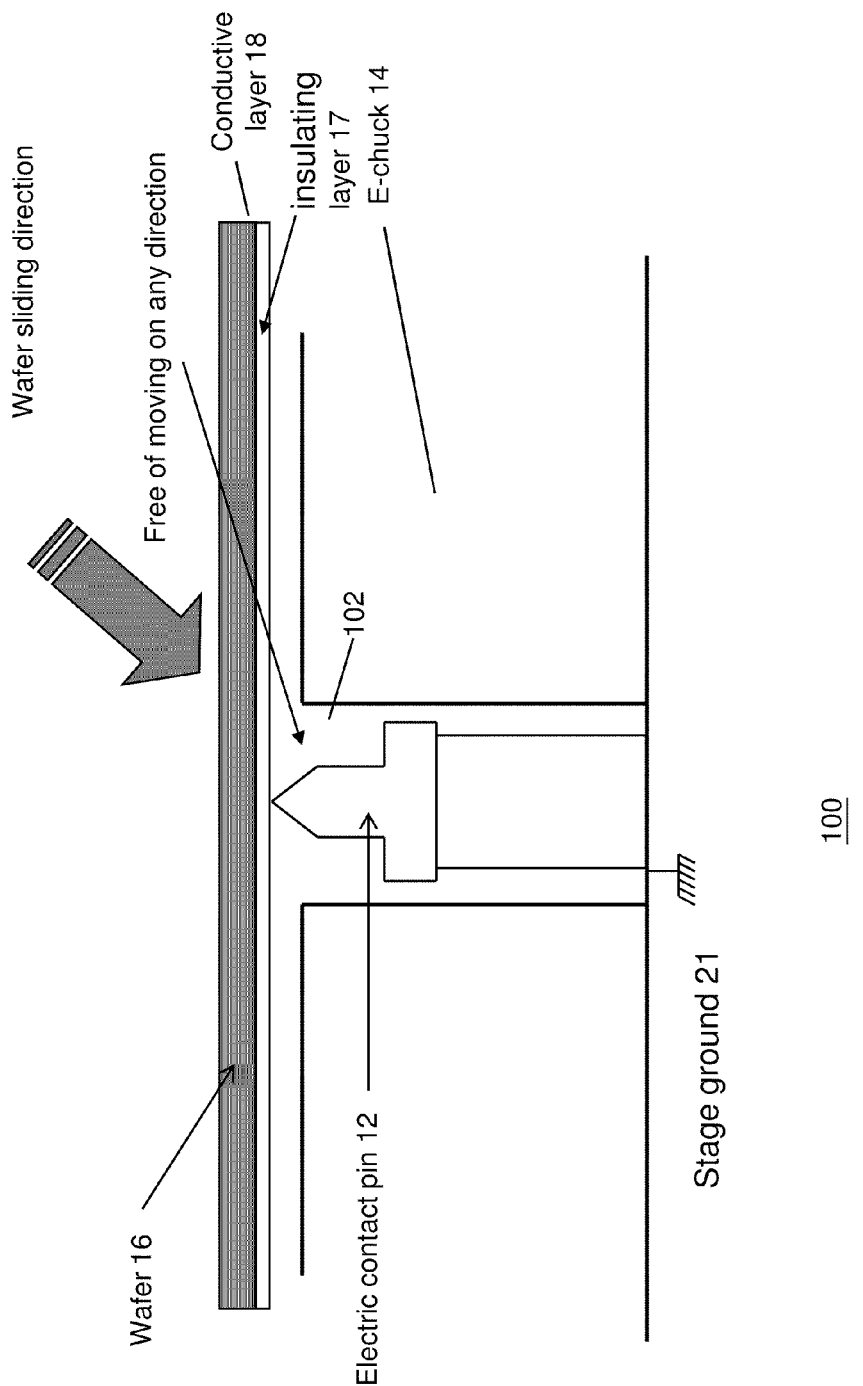
Figure 1 The electric contact pin and wafer reference position.
Prior Art

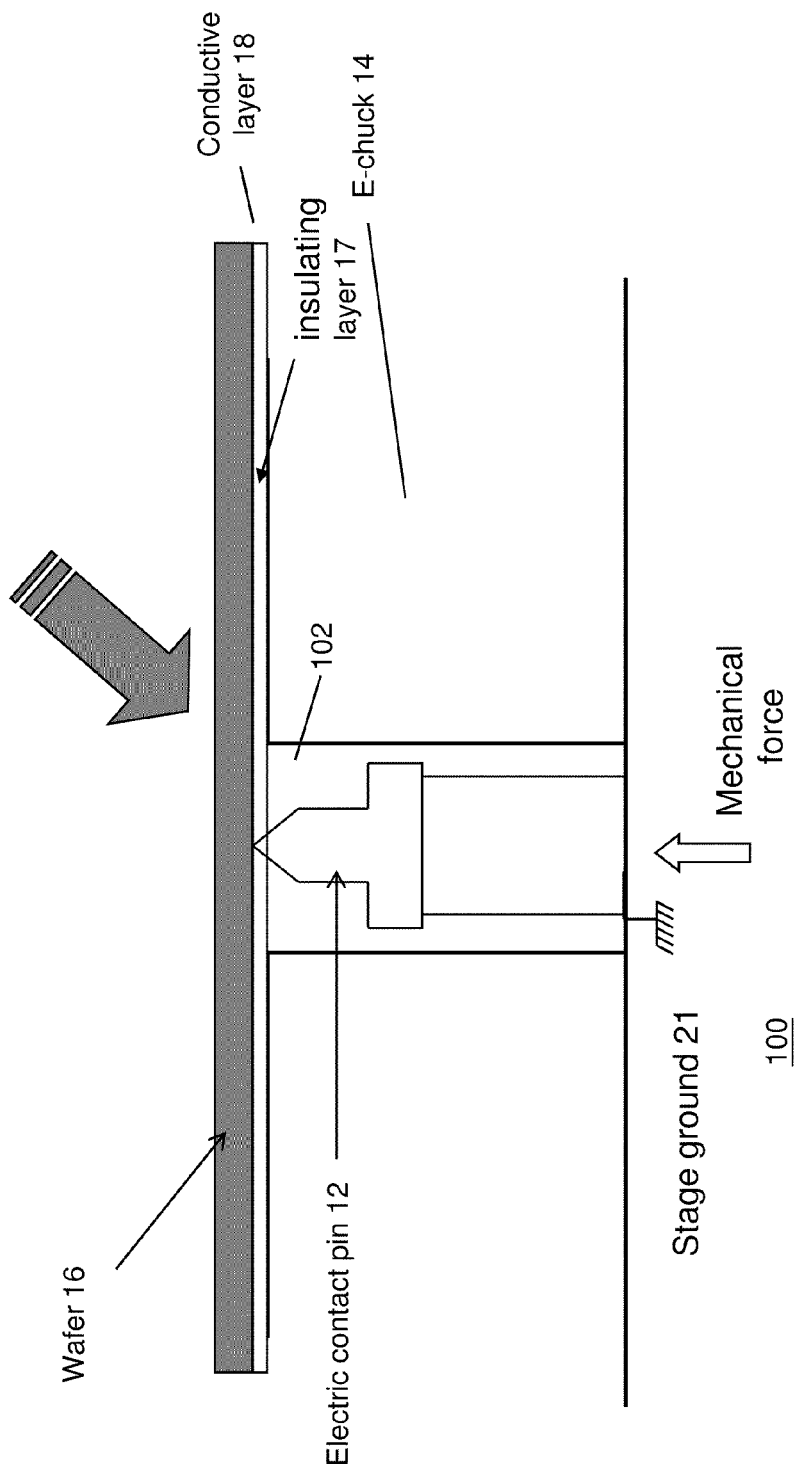
Figure 2 Electric contact pin after pierce through oxide layer.
Prior Art

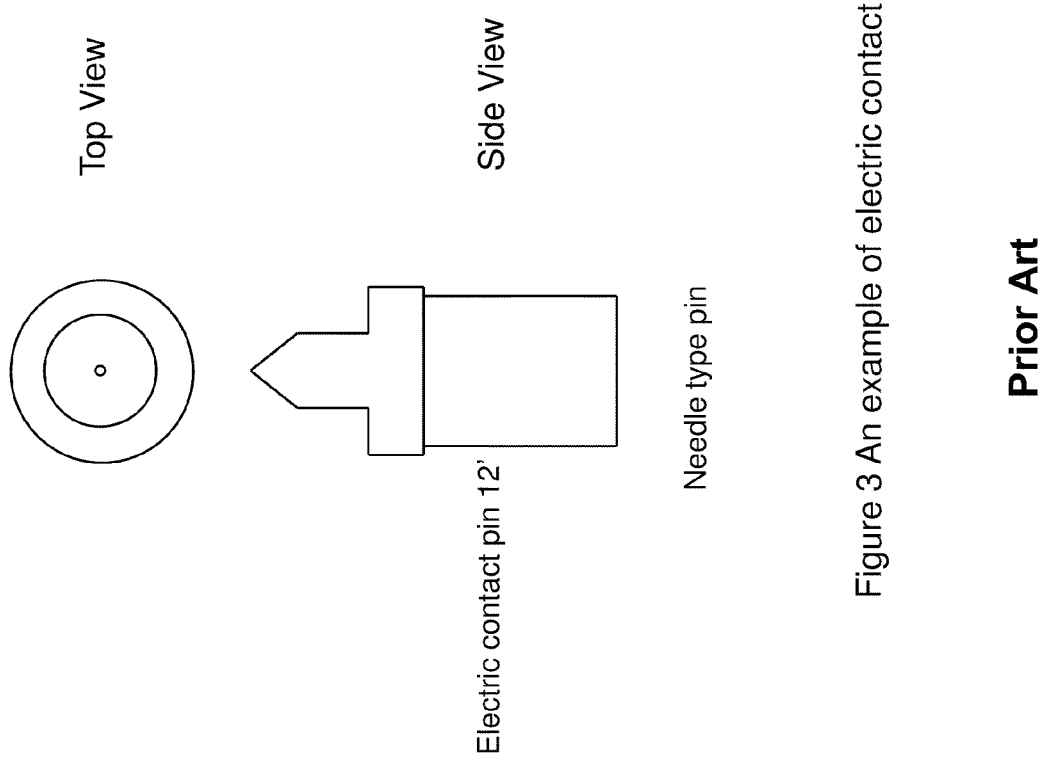

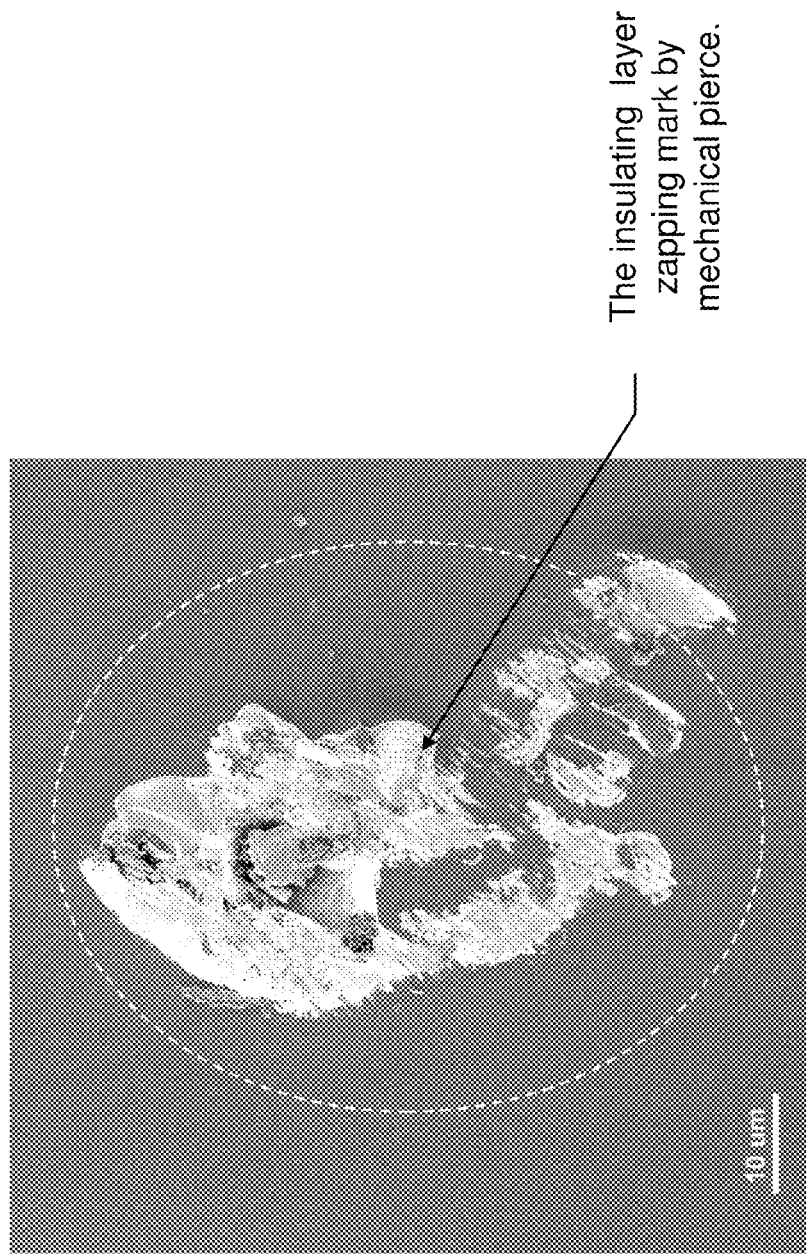
Figure 4a: The result of break through backside insulating layer by conventional method.
Prior Art

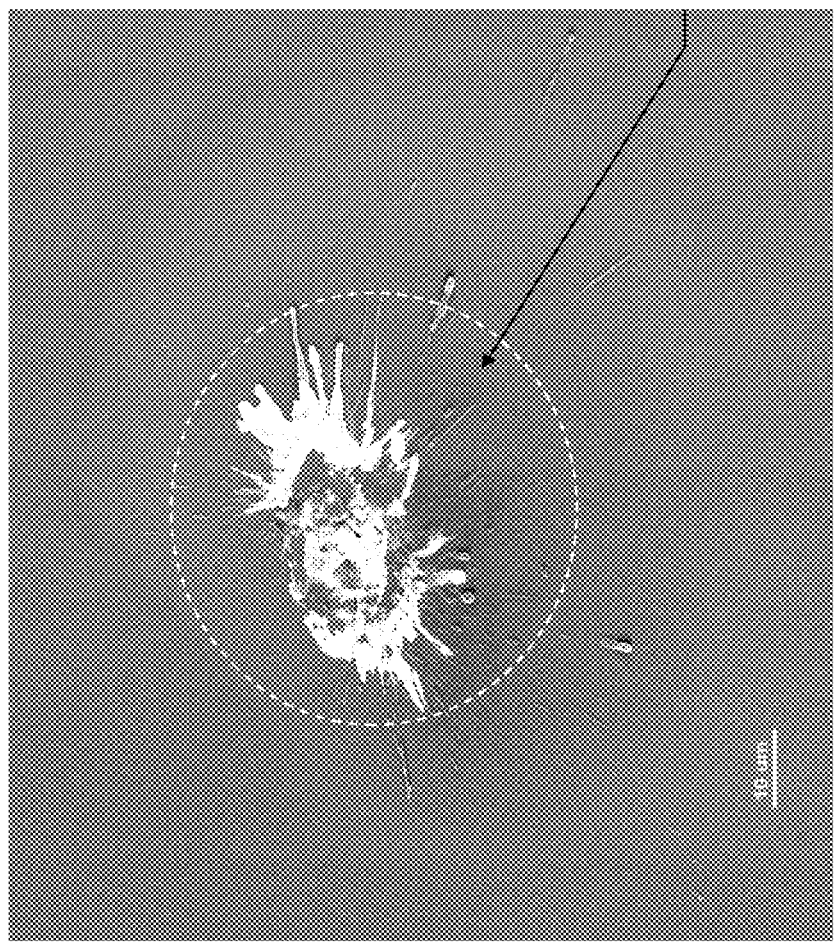
Figure 4b: The result of break through backside insulating layer by conventional method.
Prior Art

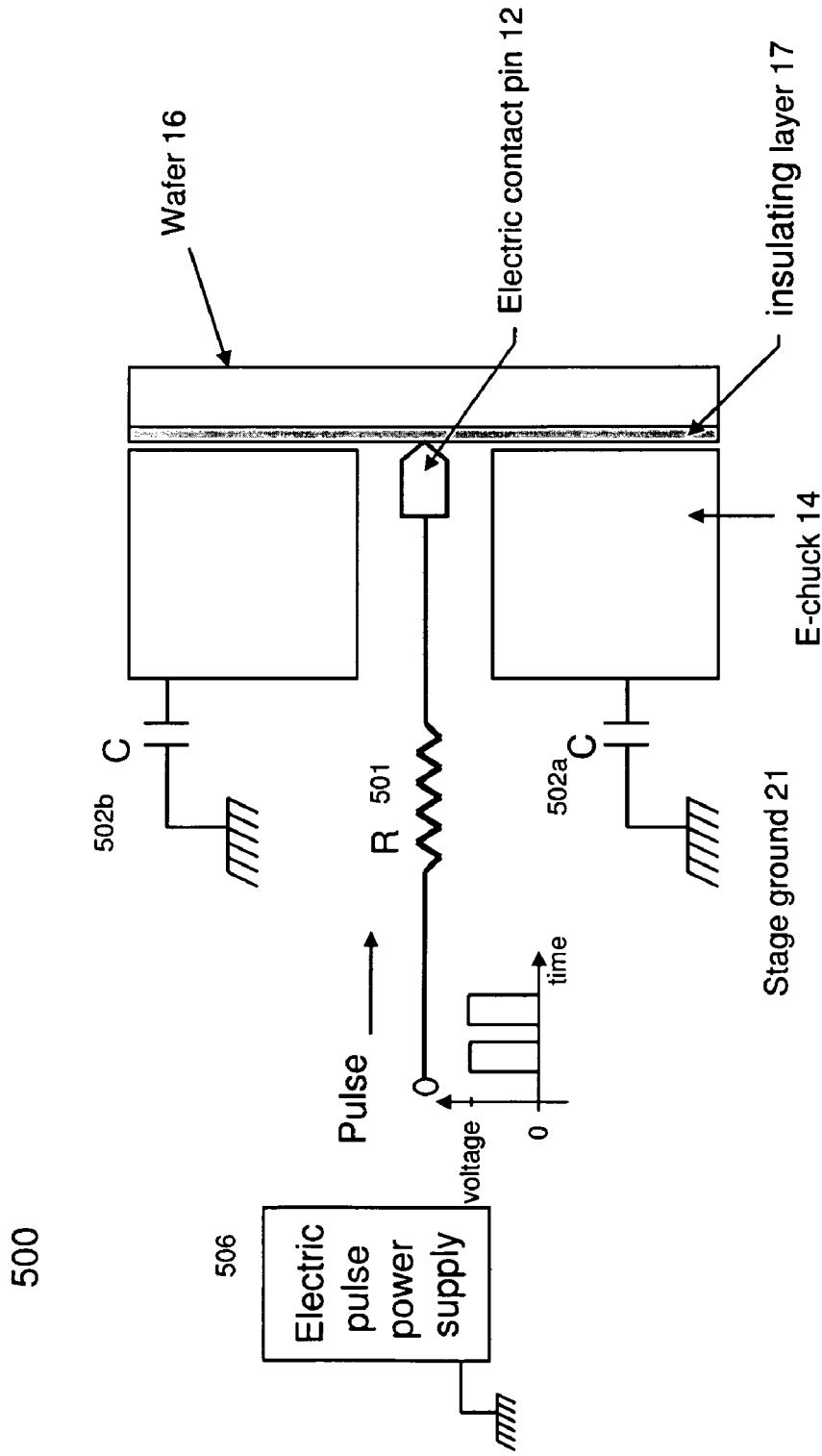
Figure 5: The setup of present invention.

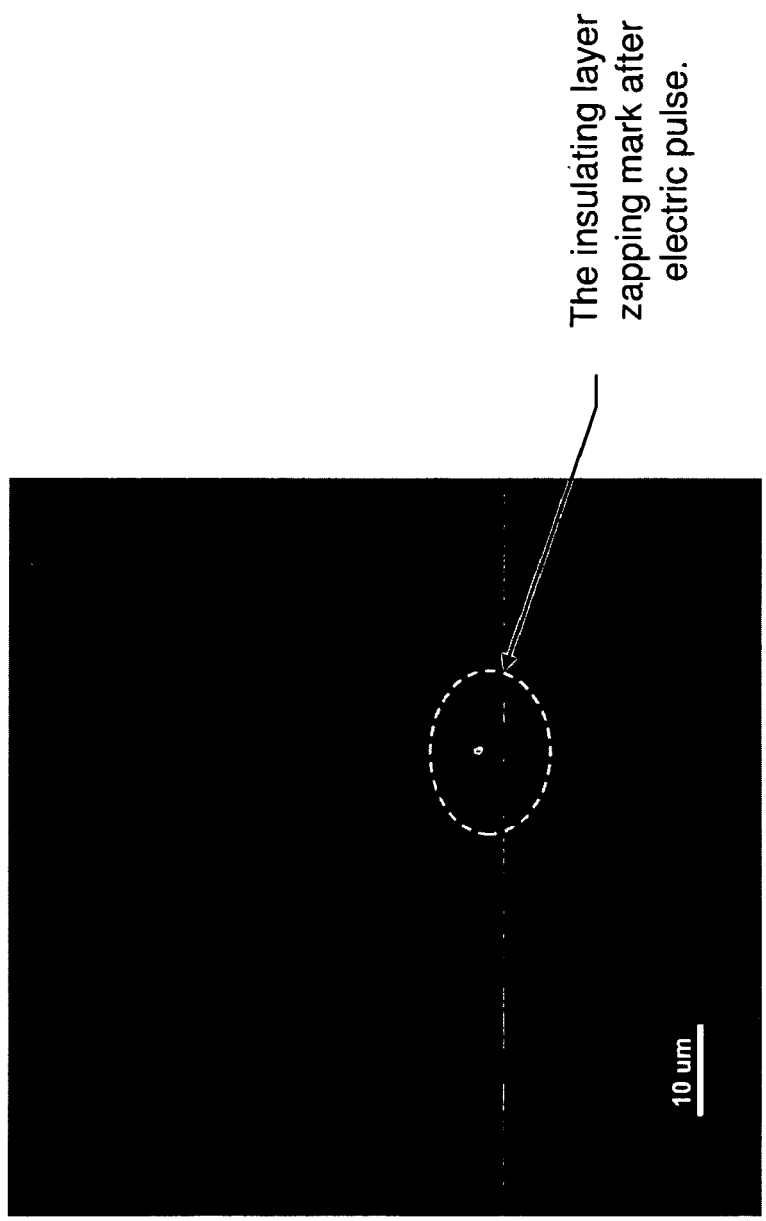
Figure 6: The result of break through backside insulating layer with present methodology.

WAFER GROUNDING METHODOLOGY

CROSS-REFERENCES TO RELATED APPLICATIONS

This application relates to U.S. patent application Ser. No. 12/179,560, filed Jul. 24, 2008 entitled, "An Apparatus for Increasing Electric Conductivity to a Semiconductor Wafer Substrate when Exposure to Electron Beam", all of which is incorporated herein by reference.

FIELD OF THE INVENTION

The present invention relates generally to an apparatus and method for increasing electric conductivity to a wafer substrate when exposed to electron beam irradiation. More specifically, the present invention relates to significantly reducing damage on the backside of a wafer substrate.

BACKGROUND

During an electron beam inspection or an electron beam lithography process of the semiconductor device fabrication, the substrate surface, i.e. wafer surface, are irradiated with electron beam. If the electric contact of the substrate or wafer is incomplete during irradiation of the electron beam onto an insulator film on the wafer, a charge-up of electrons occurs wherein electrons are accumulated on the interface between the wafer and the insulator film. The charging causes deflection of the electron beam during the irradiation thereof to deform the resultant pattern in the electron beam lithography process. The charge-up restrains the signal electrons emanating from the wafer surface and thereby deforms the image of the surface in the electron beam inspection process.

There are many ways to prevent charge accumulation on wafer surface under electron irradiation. To control landing energy of the irradiating electrons, there is U.S. Pat. No. 6,734,429 of Takagi, which suggests ejecting rare gas molecules onto the wafer surface during electron irradiation; U.S. Pat. No. 6,465,795 of Madonado et al., which is irradiating laser on the wafer surface simultaneously with electron irradiation; U.S. Pat. No. 6,753,524 of Matsui et al.; and the most common way is to utilize electric contact pins to conduct excess charge away, U.S. Pat. No. 6,068,964 of Komori. The electric contact pins make physical contact to the conductive layer on the wafer backside (by means of a mechanical punch through) or a conductive path is formed between the pins and the conductive layer (by electrically breaking through the insulating layer), resulting in a stable potential which is then can be obtained on the wafer conductive layer.

With a conventional electric contact pin design, both a mechanical punch through or electrically breakthrough with an electrical pulse, may cause great damage on the backside of a wafer. These damaged places may become particle sources following up semiconductor device fabrication processes.

Accordingly, what is needed is a system and method to address the above-identified issues. The present invention addresses such a case.

SUMMARY OF THE INVENTION

The present invention relates to an apparatus for increasing electric conductivity to a wafer substrate when exposed to electron beam irradiation. More specifically, the present invention relates to significantly reducing damage on the backside of a wafer substrate.

The embodiments of the present invention provides a methodology to introduce an electrical voltage pulse to the electric contact pins that could breakthrough the insulating layer on the backside of the wafer. The embodiments combine mechanical piercing and electrical zapping, thereby significantly decreasing the backside damage.

BRIEF DESCRIPTION OF THE DRAWINGS

FIG. 1 is a diagrammatic representation of a conventional design of an electric contact pin within an electrostatic chuck before apply chucking force.

FIG. 2 is a diagrammatic representation of a conventional design of an electric contact pin within an electrostatic chuck when chucking force is applied.

FIG. 3 is a diagrammatic representation of a top view and side view of a typical electric contact pin.

FIG. 4a is a photo of a backside damaged via the zapping mark made by the mechanical piece.

FIG. 4b is a photo of a backside damaged via a zapping mark made by electrical impact.

FIG. 5 is a simplified diagrammatic representation of an electric circuit and electric contact pin setup, according to an embodiment of the present invention.

FIG. 6 is a photo of a backside damaged after proceeding with present methodology for electrical grounding, according to an embodiment of the present invention.

DETAILED DESCRIPTION OF THE INVENTION

The present invention relates generally to an apparatus for increasing electric conductivity to a wafer substrate when exposed to electron beam irradiation. The following description is presented to enable one of ordinary skill in the art to make and use the invention and is provided within the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Reference will now be made in detail to specific embodiments of the invention. Examples of these embodiments are illustrated in the accompanying drawings. While the invention will be described in conjunction with these specific embodiments, it will be understood that it is not intended to limit the invention to these embodiments. In fact, it is intended to cover alternatives, modifications, and equivalents as may be included within the spirit and scope of the invention as defined by the appended claims. In the following description, numerous specific details are set forth in order to provide a through understanding of the present invention. The present invention may be practiced without some or all of these specific details. In other instances, well-known process operations are not described in detail in order not to obscure the present invention.

Conventionally in the semiconductor industry, a semiconductor device is manufactured on a single crystal silicon substrate surface. Silicon will act as a conductor under certain conditions; however, the backside surface of the wafer usually has an insulating layer built up during the different manufacturing processes. A typical insulating layer is silicon oxide, for example, which is an electrical insulator. The accumulated insulating layer usually has a thickness around 700 to 800 nanometers; however, sometimes it may be as thick as 2000 angstrom (0.2 micron). A conventional way to remove excess charge accumulating on the wafer is conducting the charge through electric contact pin(s). In order to conduct the charge away, the electric contact pin(s) needs to punch through the insulating layer to reach the conducting silicon crystal. FIG. 1 is a diagrammatic representation of a conventional system 100 of an electric contact pin 12 in an electrostatic chuck housing 102 before applying chucking force. One of ordinary skill in the art recognizes that although only one pin 12 and one housing 102 is shown with the chuck 14, a plurality of pins 12 and housings 102 can be utilized therein. The system 100 includes a wafer 16 which is in contact with the pin 12 via an insulating layer 17. The system 100 and electric contact pins are coupled to ground by stage ground 21. The wafer 16 is transferred onto the electrostatic chuck surface 14 by a robot (not shown). The electrostatic chuck 14 then applies chucking force to pull down and hold the wafer 16 on the electrostatic chuck surface 14. Meanwhile, the electric contact pin 12 makes physical contact to the conductive layer 18 on backside of wafer 16 (by means of mechanical punch through) or a conductive path is formed between the pin 12, for example, and the conductive layer 18 (by electrically breaking through the insulating layer 17). In either case, a stable potential can be obtained on the conductive layer 18 as illustrated in FIG. 2.

A typical electric contact pin is illustrated in FIG. 3. The sharp needle type pin 12 may pierce through the insulating layer with mechanical force and the electrostatic chucking force. The piercing through the oxide process leaves a hole on the wafer backside. FIG. 4a illustrates a typical zapping mark produced by a mechanical pierce. With the reference scale, the zapping mark is estimated about 80 microns long, with a punching hole, sliding scar and pulling the insulating layer inside out. This zapping damage could become a particle source in the following process.

Another conventional method to break through an insulating layer is applying high electric voltage to breakdown the insulating layer. This breakdown process also leaves a significant damage on the backside layer. FIG. 4b illustrates a typical zapping mark produced by electrical breakdown. With the reference scale, the zapping mark is estimated about 65 microns long, which is similar to a meteorite strike splashing the insulating layer to all over the place. Sometime, the diameter of the zapping mark may as large as 200 microns, if the electronic parameters are not carefully selected. This zapping damage also has a potential to become a particle source in the future process.

One embodiment to resolve the backside damage is to design an electric circuit that links a large resistor 501, with one or more electric contact pins 12. The resistor is typically in the range of 20K ohms to 200K ohms. The electrostatic chuck 14 is coupled to capacitance 502a and 502b. An electric pulse power supply 506 that can produce unidirectional electric pulse provides the breakdown voltage to the electrostatic chuck 14 via the resistor 501 and one or more contact pings. The unidirectional pulse may be a positive voltage pulse or a negative voltage pulse. However, a positive pulse voltage is used in the present invention as an example. The unidirectional pulse may be one or a series of positive or negative pulses. FIG. 5 illustrates a simplified diagrammatic representation of an electric circuit and electric contact pin setup. As is seen, the power supply 506 and the electrostatic chuck 14 are coupled to stage ground.

The unidirectional positive electric pulse could strike the wafer one or more times to breakdown the backside oxide layer and leave a zapping mark less than 1 micron. FIG. 6 illustrates a typical zapping mark produced by the present invention.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An apparatus for increasing electric conductivity to a wafer substrate, comprising:
    an electrostatic chuck to hold a wafer, the electrostatic chuck having one or more pin housing holes, the electrostatic chuck being coupled to one or more capacitors;
    one or more of electric contact pins individually corresponding to the pin housing holes, the one or more pins being coupled to one or more resistors; and
    an electric pulse power supply, wherein the electric contact pins, the electrostatic chuck, and the electric pulse power supply are designed to resolve backside damage to the a wafer substrate.

2. The apparatus as claimed in claim 1, wherein the electric pulse power supply outputs unidirectional electric pulse voltage.

3. The apparatus as claimed in claim 2, wherein the unidirectional electric pulse voltage is either one or a series of positive pulse voltages.

4. The apparatus as claimed in claim 2, wherein the unidirectional electric pulse voltage is either one or a series of negative pulse voltages.

5. The apparatus as claimed in claim 1, wherein the electrostatic chuck and the electric pulse power supply is electrically connected to a stage ground.

6. An apparatus for decreasing damage to a wafer substrate in E-beam inspecting the wafer substrate, comprising:
    at least one electric contact pin, in at least one pin housing hole of an electrostatic chuck, contacting to backside of the wafer substrate;
    an electric pulse power supply for providing pulse to the at least one electric contact pin; and
    at least one resistor coupled between the at least one electric contact pin and the electric pulse power supply.

7. The apparatus as claimed in claim 6, further comprising at least one capacitor coupled to the electrostatic chuck.

8. The apparatus as claimed in claim 6, wherein the electric pulse power supply outputs unidirectional electric pulse voltage.

9. The apparatus as claimed in claim 8, wherein the unidirectional electric pulse voltage is either one or a series of positive pulse voltages.

10. The apparatus as claimed in claim 8, wherein the unidirectional electric pulse voltage is either one or a series of negative pulse voltages.

11. The apparatus as claimed in claim 6, the electrostatic chuck and the electric pulse power supply is electrically connected to a stage ground.

12. A method for increasing electric conductivity to a wafer substrate, comprising:
    providing a circuit to at least one electric contact pin in at least one pin housing hole of an electrostatic chuck, wherein the circuit includes an electric pulse power supply, and at least one resistor coupled between the at least one electric contact pin and the electric pulse power supply, wherein the at least one electric contact pin contacts to backside of the wafer substrate; and
    providing unidirectional electric pulse voltage to the at least one electric contact pin, such that a zapping mark less than one micrometer is formed at the backside of the wafer substrate.

13. The method as claimed in claim 12, wherein the electrostatic chuck couples to at least one capacitor.

14. The method as claimed in claim 12, wherein the electric pulse power supply outputs unidirectional electric pulse voltage.

15. The method as claimed in claim 14, wherein the unidirectional electric pulse voltage is either one or a series of positive pulse voltages.

16. The method as claimed in claim 14, wherein the unidirectional electric pulse voltage is either one or a series of negative pulse voltages.

17. The method as claimed in claim 13, the electrostatic chuck and the electric pulse power supply is electrically connected to a stage ground.

* * * * *